(12) United States Patent
Dohi

(10) Patent No.: US 9,337,172 B2
(45) Date of Patent: May 10, 2016

(54) SEMICONDUCTOR DEVICE

(71) Applicant: Panasonic Corporation, Osaka (JP)

(72) Inventor: Shigefumi Dohi, Kanagawa (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/822,253

(22) Filed: Aug. 10, 2015

(65) Prior Publication Data

US 2015/0348946 A1  Dec. 3, 2015

Related U.S. Application Data

(63) Continuation of application No. PCT/JP2013/005899, filed on Oct. 3, 2013.

(30) Foreign Application Priority Data

Feb. 25, 2013 (JP) .................................. 2013-034184

(51) Int. Cl.
*H01L 23/02* (2006.01)
*H01L 23/48* (2006.01)
(Continued)

(52) U.S. Cl.
CPC .......... *H01L 25/0657* (2013.01); *H01L 21/561* (2013.01); *H01L 21/565* (2013.01); *H01L 21/568* (2013.01); *H01L 23/3128* (2013.01); *H01L 24/08* (2013.01); *H01L 24/19* (2013.01); *H01L 24/32* (2013.01); *H01L 24/48* (2013.01);
(Continued)

(58) Field of Classification Search
CPC .......... H01L 2224/73265; H01L 2224/48227; H01L 2224/48247; H01L 2224/32145; H01L 25/0657; H01L 2224/48145; H01L 23/49575; H01L 24/85; H01L 2225/0651; H01L 2224/48257; H01L 2224/4911
USPC .......... 257/686, 690, 693; 438/107, 109, 612, 438/618
See application file for complete search history.

(56) References Cited

U.S. PATENT DOCUMENTS 8,866,284 B2 * 10/2014 Kobayashi ........ H01L 23/49575
257/692
2013/0299957 A1  11/2013  Kobayashi et al.
2014/0000940 A1  1/2014  Onitsuka et al.

FOREIGN PATENT DOCUMENTS

JP  2000-138238  5/2000
JP  2006-121034  5/2006
(Continued)

OTHER PUBLICATIONS

International Search Report of PCT application No. PCT/JP2013/005899 dated Jan. 7, 2014.

*Primary Examiner* — Hsien Ming Lee
(74) *Attorney, Agent, or Firm* — McDermott Will & Emery LLP

(57) ABSTRACT

Provided is a small and thin semiconductor device while preventing contamination of a wire bonding terminal caused by creeping-up of a die bond. The semiconductor device includes: a first semiconductor chip having a main surface formed with electrodes; an extension part extended outward from a side end surface of the first semiconductor chip; a rewiring layer formed from the main surface of the first semiconductor chip to a first surface of the extension part; a connection terminal provided on the rewiring layer of the extension part; a die bond that fixes the first semiconductor chip and the extension part to a substrate; and in the extension part, a step outside the connection terminal.

17 Claims, 12 Drawing Sheets

(51) Int. Cl.
*H01L 21/44* (2006.01)
*H01L 25/065* (2006.01)
*H01L 23/00* (2006.01)
*H01L 21/56* (2006.01)
*H01L 23/31* (2006.01)
*H01L 25/18* (2006.01)

(52) U.S. Cl.
CPC ............... H01L 24/96 (2013.01); H01L 24/97 (2013.01); *H01L 24/05* (2013.01); *H01L 24/16* (2013.01); *H01L 24/45* (2013.01); *H01L 24/73* (2013.01); *H01L 25/18* (2013.01); *H01L 2224/0401* (2013.01); *H01L 2224/04042* (2013.01); *H01L 2224/04105* (2013.01); *H01L 2224/0557* (2013.01); *H01L 2224/05553* (2013.01); *H01L 2224/05569* (2013.01); *H01L 2224/05572* (2013.01); *H01L 2224/05611* (2013.01); *H01L 2224/05644* (2013.01); *H01L 2224/05647* (2013.01); *H01L 2224/05655* (2013.01); *H01L 2224/08501* (2013.01); *H01L 2224/16145* (2013.01); *H01L 2224/32145* (2013.01); *H01L 2224/32221* (2013.01); *H01L 2224/32225* (2013.01); *H01L 2224/45124* (2013.01); *H01L 2224/45144* (2013.01); *H01L 2224/45147* (2013.01); *H01L 2224/48221* (2013.01); *H01L 2224/48227* (2013.01); *H01L 2224/48611* (2013.01); *H01L 2224/48644* (2013.01); *H01L 2224/48647* (2013.01); *H01L 2224/48655* (2013.01); *H01L 2224/48711* (2013.01); *H01L 2224/48744* (2013.01); *H01L 2224/48747* (2013.01); *H01L 2224/48755* (2013.01); *H01L 2224/48811* (2013.01); *H01L 2224/48844* (2013.01); *H01L 2224/48847* (2013.01); *H01L 2224/48855* (2013.01); *H01L 2224/73204* (2013.01); *H01L 2224/73265* (2013.01); *H01L 2224/97* (2013.01); *H01L 2225/0651* (2013.01); *H01L 2225/06513* (2013.01); *H01L 2225/06541* (2013.01); *H01L 2924/00014* (2013.01); *H01L 2924/1431* (2013.01); *H01L 2924/1434* (2013.01); *H01L 2924/15311* (2013.01); *H01L 2924/15787* (2013.01); *H01L 2924/181* (2013.01); *H01L 2924/1815* (2013.01); *H01L 2924/18162* (2013.01); *H01L 2924/19107* (2013.01)

(56) References Cited

FOREIGN PATENT DOCUMENTS

| | | |
|---|---|---|
| JP | 2007-012716 | 1/2007 |
| JP | 2009-164420 | 7/2009 |
| WO | 2012/057286 | 5/2012 |
| WO | 2012/107972 | 8/2012 |

* cited by examiner

SEMICONDUCTOR DEVICE

BACKGROUND OF THE INVENTION

1. Field of the Invention

The present disclosure relates to a semiconductor device configured by laminating semiconductor chips.

2. Description of the Related Art

In a system, such as a digital television or a recorder, a data volume to be handled has dramatically increased due to an advanced function of the system. Accordingly, capacity of a semiconductor memory mounted in the system has increased. Further, a semiconductor memory having a high data transfer rate has been required.

PTL 1 discloses a semiconductor device in which a first extended semiconductor chip includes an extension part extending outward from a side surface and a second semiconductor chip is mounted on the first extended semiconductor chip. In this configuration, a wire bonding terminal can be provided at the extension part by a rewiring layer. Accordingly, it is not necessary to dispose a large semiconductor chip on a lower side, and restrictions on degrees of freedom in designing the semiconductor chip can be avoided.

CITATION LIST

Patent Literature

PTL 1: Japanese Patent No. 5,066,302

In PTL 1, the lower semiconductor chip is fixed to a substrate by a die bond. At this time, since the die bond creeps up on the side surface of the lower semiconductor chip, the wire bonding terminal disposed at the extension part can be contaminated by the die bond depending on a thickness of the chip and viscosity of the die bond.

Particularly, in a case where the extension part is formed of a resin, the extension part has minute unevenness on a surface as compared with a cross-section of a silicon substrate. Accordingly, creeping-up of the die bond to the extension part easily occurs due to capillarity. Further, since wettability of identical or similar materials is generally better, a die bond mainly formed of resin creeps up more remarkably to the extension part formed of a resin.

In order to avoid such contamination of the wire bonding terminal by the die bond, it is considered that the wire bonding terminal is arranged closer to the semiconductor chip side. However, since the extension part is originally formed due to a small size of the lower semiconductor chip, there is no room in an arrangement region. Further, since it is necessary to consider contamination of the wire bonding terminal from the semiconductor chip side, such as extrusion of an adhesive (an underfill or the like) for firmly fixing the upper semiconductor chip, the arrangement is not realistic.

Besides, from a viewpoint of miniaturization and thinning of the semiconductor device, it is not desirable that the region of the extension part be widened to lengthen a distance between the wire bonding terminal and an end of the extension part, or that the lower semiconductor chip be simply thickened to lengthen a distance of a side surface.

SUMMARY OF THE INVENTION

The present disclosure provides a semiconductor device that is effective for preventing contamination of a wire bonding terminal caused by creeping-up of a die bond to an extension part without hindering miniaturization and thinning of the semiconductor device.

A semiconductor device in the present disclosure includes a first semiconductor chip having a main surface formed with a plurality of electrodes, an extension part extended outward from a side end surface of the first semiconductor chip, and a second semiconductor chip mounted on the main surface of the first semiconductor chip. Further, the semiconductor device includes a rewiring layer formed from the main surface of the first semiconductor chip to a first surface of the extension part, a wire bonding terminal provided on the rewiring layer of the extension part, a die bond that fixes the first semiconductor chip and the extension part to a package substrate, and, in an outer edge region of the extension part, a step outside the wire bonding terminal.

The semiconductor device in the present disclosure prevents creeping-up of the die bond to the extension part by providing the step in the outer edge region of the extension part, and is effective for preventing contamination of the wire bonding terminal without hindering miniaturization and thinning of the semiconductor device.

DETAILED DESCRIPTION OF THE PREFERRED EMBODIMENTS

Figure 1A:
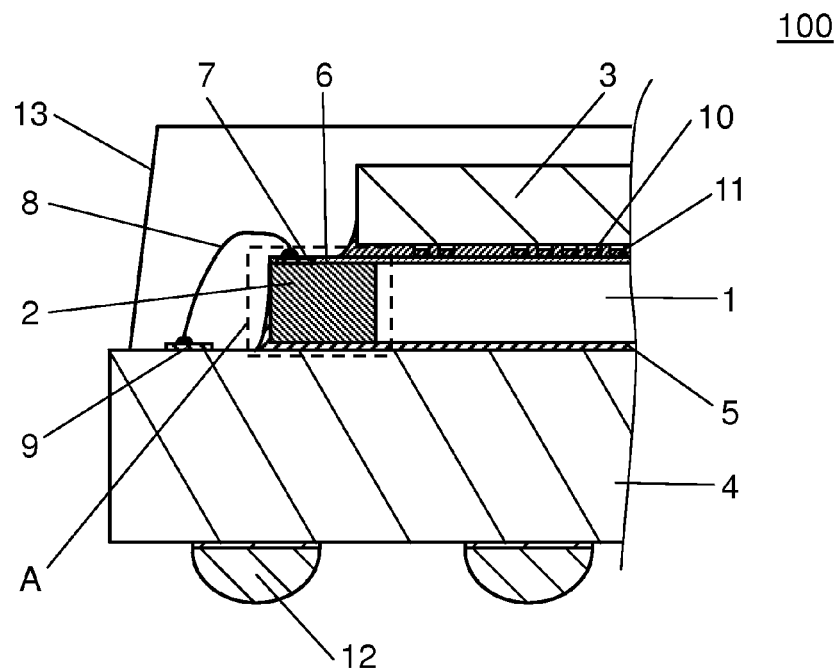
FIG. 1A is a sectional view illustrating a configuration of a semiconductor device according to a first exemplary embodiment.

Hereinafter, a semiconductor device of the present disclosure will be described while appropriately referring to the drawings. However, detailed description of a well-known matter, overlapping description of substantially the same configuration, or the like may be omitted. This is to avoid unnecessary redundancy of the following description and to be easily understood by those skilled in the art.

The accompanying drawings and the following description are provided so that those skilled in the art fully understand the present disclosure. It is not intended that a subject described in the claims be limited by these drawings and description.

First Exemplary Embodiment

Figure 1B:
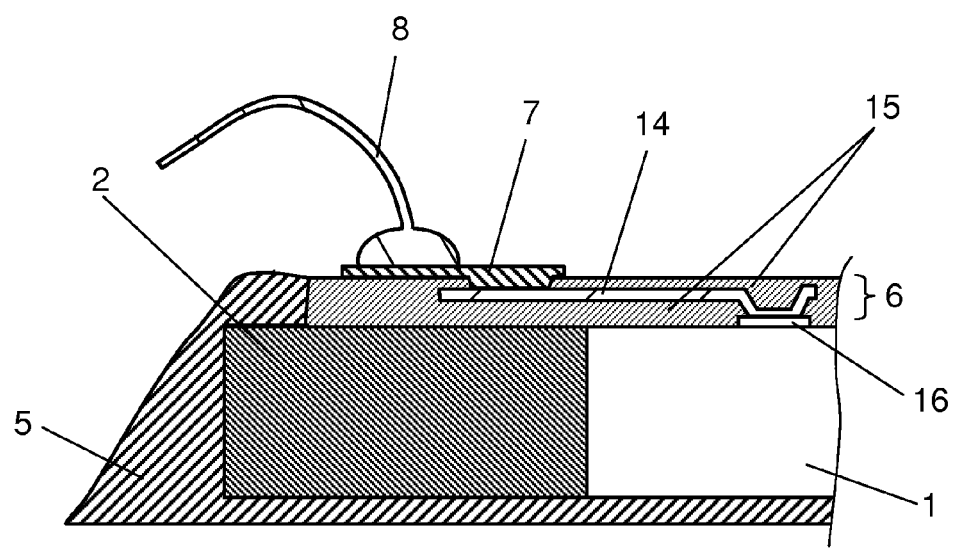
FIG. 1B is an enlarged view of an inside of a broken line A frame in FIG. 1A.

FIG. 1A is a sectional view schematically illustrating a configuration of a semiconductor device according to a present exemplary embodiment, and FIG. 1B is an enlarged view of a part of the semiconductor device.

Semiconductor device 100 illustrated in FIG. 1A has first semiconductor chip 1, extension part 2 extended outward from a side end surface of first semiconductor chip 1, second semiconductor chip 3 mounted on first semiconductor chip 1, and package substrate 4 on which first semiconductor chip 1 and extension part 2 are placed. A resin, such as epoxy, which is easily molded and processed is suitable for a material of extension part 2. First semiconductor chip 1 and extension part 2 are firmly fixed to package substrate 4 by die bond 5. Die bond 5 covers a rear surface of first semiconductor chip 1, a rear surface of extension part 2, and at least a part of a side surface of extension part 2.

First semiconductor chip 1 has a plurality of electrodes (not illustrated) on a main surface that faces second semiconductor chip 3. Rewiring layer 6 is disposed from the main surface of first semiconductor chip 1 to a first surface of extension part 2, and wire bonding terminal 7 is formed in a region of extension part 2. Wire bonding terminal 7 is electrically connected with first semiconductor chip 1 via rewiring layer 6. Wire bonding terminal 7 may be formed of copper or nickel or may be a lamination structure formed of copper/solder or nickel/gold or the like. A material for configuring the solder is, for example, a tin-silver-based, a tin-copper-based, a tin-bismuth-based, or a tin-indium-based alloy having an excellent mechanical property. Further, wire bonding terminal 7 is connected with electrode pad 9 on package substrate 4 by wire 8. Wire 8 is a conductive member, and is, for example, a copper wire, a gold wire, or an aluminum wire.

Second semiconductor chip 3 and first semiconductor chip 1 are electrically connected via bump 10, and a joint is firmly fixed by adhesive material 11. Adhesive material 11 is, for example, an underfill material serving as an adhesive force reinforcing agent. A liquid epoxy resin, a resin sheet, an ACF (Anisotropic Conductive Film), or the like can be adopted as a material for adhesive material 11.

External terminal 12 is disposed on a rear surface of package substrate 4, and semiconductor device 100 is electrically connected with a mother substrate or the like via this external terminal 12. Upper surfaces of first semiconductor chip 1, second semiconductor chip 3, and package substrate 4 are sealed by sealing resin 13.

FIG. 1B is an enlarged view of an inside of a broken line A frame in FIG. 1A.

Rewiring layer 6 includes rewiring 14 and insulation layer 15. Since rewiring 14 is generally formed by electroplating using photolithography, a wiring thickness is about 3 µm to 5 µm, and a width can be arbitrarily prepared. Rewiring 14 is characterized in that a dimension is large and electric resistance is small as compared with wiring inside first semiconductor chip 1. Copper that is capable of being formed by an easy process, such as electroplating, and has excellent electric conductivity is suitable for rewiring 14. When a resin, such as PI (Polyimide) or PBO (Polybenzoxazole), is applied to insulation layer 15, processing is easy and a high protection effect is achieved.

Electrode 16 provided at a peripheral edge of first semiconductor chip 1 is connected with rewiring 14 of rewiring layer 6 and is capable of supplying power to a region of extension part 2 relative to first semiconductor chip 1. In other words, in the region of extension part 2, rewiring 14 is connected with wire bonding terminal 7 formed on rewiring layer 6. In this way, first semiconductor chip 1 is electrically connected with wire bonding terminal 7 via rewiring layer 6. In other words, the electrical connection of wire bonding terminal 7 is drawn out from first semiconductor chip 1 to extension part 2.

In the sectional view, an end of rewiring layer 6 is provided inside an end of extension part 2 and is formed so as to configure a step by extension part 2 and rewiring layer 6. More specifically, on an outside of wire bonding terminal 7, insulation layer 15 of rewiring layer 6 forms the step relative to the first surface of extension part 2. With this configuration, even when die bond 5 creeps up from the side surface to the upper surface of extension part 2 by its own surface tension, moving speed of die bond 5 can be reduced by the step and creeping-up of die bond 5 to wire bonding terminal 7 can be prevented.

Figure 2:
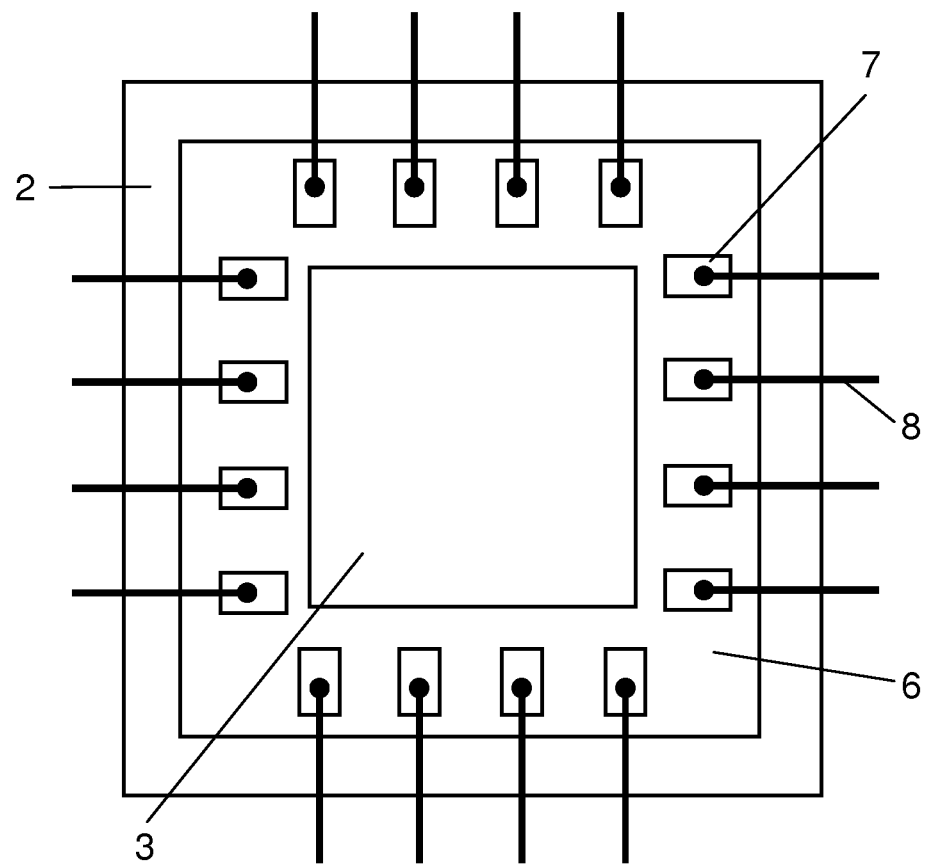
FIG. 2 is a plan view illustrating the configuration of the semiconductor device according to the first exemplary embodiment.

It is desirable that the step in an outer edge region of extension part 2 be formed corresponding to arrangement of wire bonding terminal 7. For example, as illustrated in FIG. 2, in a form that wire bonding terminals 7 are arranged on four sides, it is effective that the step is provided in the outer edge region of extension part 2 so as to surround the four sides.

Hereinabove, in semiconductor device 100 of the present exemplary embodiment, since the step is provided in the outer edge region of extension part 2, wire bonding terminal 7 arranged on rewiring layer 6 of extension part 2 can be prevented from being contaminated by creeping-up of die bond 5. With this configuration, since it is not necessary to increase a thickness or a plane size of extension part 2 against creeping-up of die bond 5, miniaturization and thinning is not prevented. Further, since it is not necessary to draw wire bonding terminal 7 to inside, wire bonding terminal 7 can be arranged while keeping a distance that contamination by adhesive material 11 does not occur.

An effect of the present disclosure is more remarkable when first semiconductor chip 1 is thinned. It is because, in general, when a thickness of first semiconductor chip 1 is about 200 μm or less, a contamination risk of wire bonding terminal 7 caused by creeping-up of die bond 5 increases. At this time, rewiring layer 6 may be provided inside the end of extension part 2 by a length that deducts the thickness of first semiconductor chip 1 from 200 μm. In other words, when the thickness of first semiconductor chip 1 is 150 rewiring layer 6 is provided inside extension part 2 by 50 μm or more. When the thickness of first semiconductor chip 1 is 100 rewiring layer 6 is provided inside extension part 2 by 100 μm or more. Accordingly, the above-described contamination risk can be reduced more reliably.

In aforementioned semiconductor device 100, first semiconductor chip 1 may be a semiconductor logic circuit chip, and second semiconductor chip 3 may be a semiconductor memory chip. Further, a plurality of second semiconductor chips 3 may be laminated on first semiconductor chip 1 depending on required memory capacity. Moreover, a plurality of first semiconductor chips 1 coupled with extension part 2 may be also laminated on package substrate 4 according to a required function.

Further, in FIG. 1A, the end of first semiconductor chip 1 is provided inside an end of second semiconductor chip 3. However, in a case where it is difficult to arrange wire bonding terminal 7 unless extension part 2 is provided outward from the end of first semiconductor chip 1, the form is not limited to this. For example, the ends of the upper and lower chips may be provided on the same line, or the end of first semiconductor chip 1 may be provided slightly to the outside.

Further, it is assumed that package substrate 4 is mainly a resin substrate. However, package substrate 4 may be a ceramic substrate. Alternatively, a die pad and a lead may be used instead of package substrate 4. A configuration using a lead frame can be manufactured readily and inexpensively as a whole.

Further, extension part 2 may be extended from not only the side surface of first semiconductor chip 1 but also the rear surface of semiconductor chip 1 opposite to the main surface provided with electrode 16. Extension part 2 may be provided on four sides of the side surface of first semiconductor chip 1, and may be provided only on facing two sides or adjacent two sides. For example, when only two sides are large enough for the arrangement region of wire bonding terminal 7, semiconductor device 100 can be miniaturized by extending only the two sides.

Further, a plurality of columns of wire bonding terminals 7 may be formed on extension part 2. In this case, not only the electrical connection from first semiconductor chip 1 to extension part 2 but also electrical connection between the wire bonding terminals within extension part 2 can be performed.

Further, rewiring layer 6 may be formed on an entire surface of first semiconductor chip 1 or may be formed partially. Specifically, if the electrical connection of wire bonding terminal 7 is only drawn out from first semiconductor chip 1 to extension part 2, rewiring layer 6 may be disposed only from the peripheral edge of first semiconductor chip 1 provided with electrode 16 to extension part 2. When rewiring layer 6 is utilized to stably supply power to centers of first semiconductor chip 1 and second semiconductor chip 3, rewiring layer 6 may be disposed by extending to the chip centers.

Further, the step in the outer edge region of extension part 2 may be provided continuously along an outer periphery of the extension part, or may be provided intermittently. Further, when wire bonding terminal 7 is disposed only on the two sides or the like, the step may be also formed only on these two sides.

Further, die bond 5 that covers from the side surface to the first surface of extension part 2 and stops by reaching the end of rewiring layer 6 has highest connection reliability. However, it is also possible that die bond 5 only covers a part of the first surface of extension part 2 and does not reach the end of rewiring layer 6.

First Variation of First Exemplary Embodiment

In semiconductor device 100 illustrated in FIGS. 1A and 1B, the step in the outer edge region of extension part 2 is formed by rewiring layer 6 and the first surface of extension part 2. In this configuration, the step for suppressing the creeping-up of die bond 5 is only one step having a thickness of rewiring layer 6.

FIGS. 3 to 6 are sectional views schematically illustrating a part of a semiconductor device according to a first variation of the first exemplary embodiment. The "part" indicates a configuration of a part corresponding to the inside of the broken line A frame in semiconductor device 100 in FIG. 1A.

Figure 3:
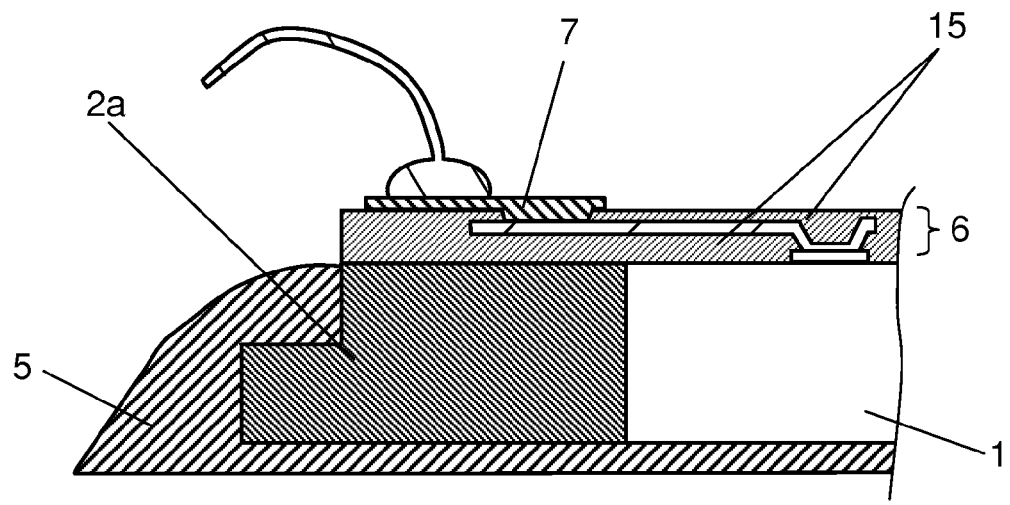
FIG. 3 is a sectional view illustrating a configuration of a semiconductor device according to a first variation of the first exemplary embodiment.

In an example illustrated in FIG. 3, a step in an outer edge region of extension part 2a is formed not by rewiring layer 6 but at an end of extension part 2a itself. In other words, the step is not formed by a first surface of extension part 2a and rewiring layer 6 formed on the first surface, and ends are flush with each other. The step has a shape where a rear surface side of extension part 2a is protruded. As in an example illustrated in FIG. 4, a step may be formed in a shape where insulation layer 15 of rewiring layer 6 and extension part 2b are cut out in an oblique direction.

Figure 5:
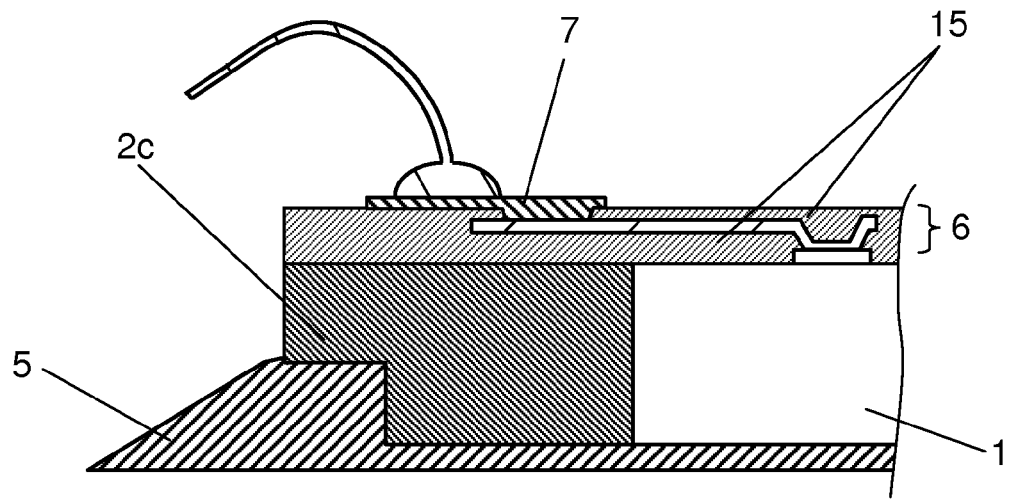
FIG. 5 is a sectional view illustrating a configuration of a semiconductor device according to the first variation of the first exemplary embodiment.

In an example illustrated in FIG. 5 as well, a step in an outer edge region of extension part 2c is formed not by rewiring layer 6 but at an end of extension part 2c itself. The step has a shape where a rear surface side of extension part 2c is recessed. As in an example illustrated in FIG. 6, a step may be formed in a shape where extension part 2d is cut out in an oblique direction.

In these configurations, when die bond 5 creeps up from the rear surface of first semiconductor chip 1 in a direction of the main surface by surface tension, creeping-up speed of die bond 5 is reduced by each step of extension parts 2a to 2d. Accordingly, these configurations can prevent die bond 5 from reaching rewiring layer 6 on the first surface. Therefore, infiltration and contamination of wire bonding terminal 7 by die bond 5 can be prevented.

In this way, by providing the step in each outer edge region of extension parts 2a to 2d, creeping-up of die bond 5 can be suppressed before die bond 5 reaches rewiring layer 6, and it is possible to prevent the contamination of wire bonding terminal 7.

Figure 4:
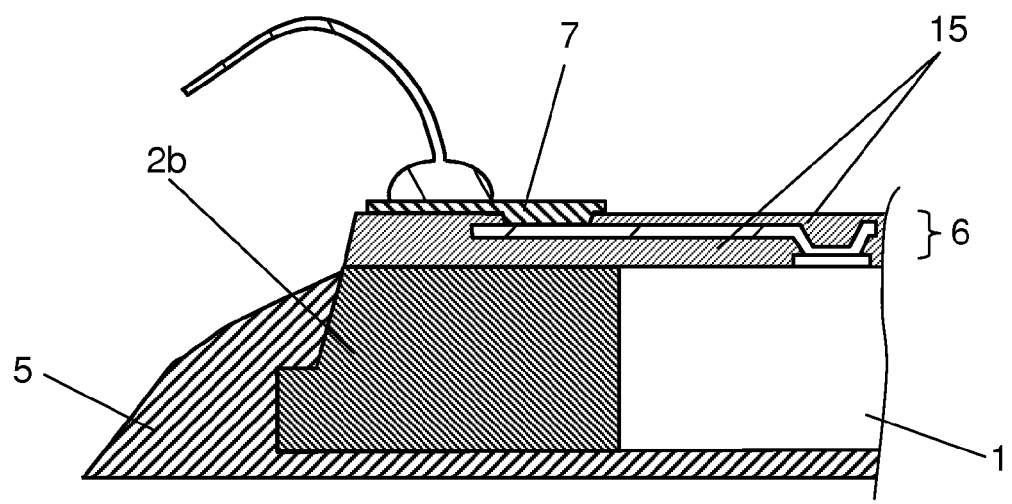
FIG. 4 is a sectional view illustrating a configuration of a semiconductor device according to the first variation of the first exemplary embodiment.
Figure 6:
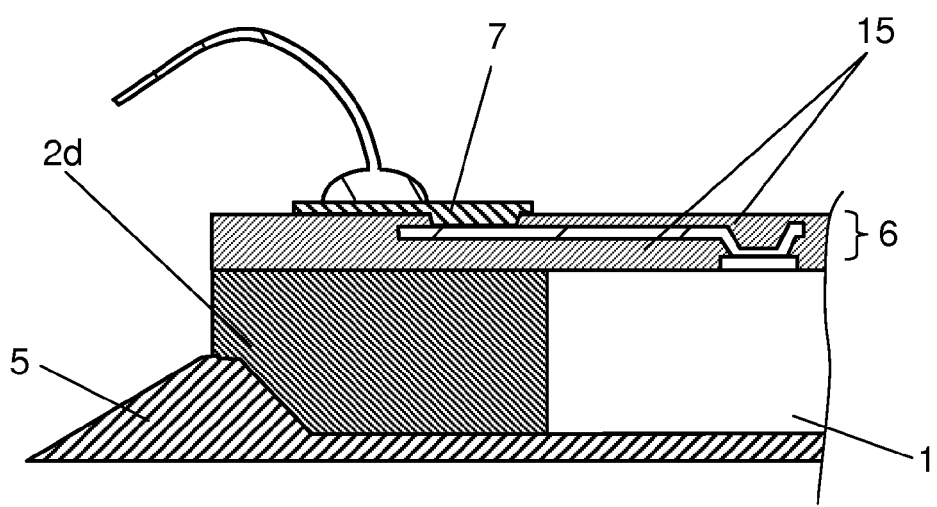
FIG. 6 is a sectional view illustrating a configuration of a semiconductor device according to the first variation of the first exemplary embodiment.

Further, since the configurations in FIGS. 5 and 6 have high effects of suppressing creeping-up of die bond 5 as compared with the configurations in FIGS. 3 and 4, the effect can be expected even when first semiconductor chip 1 is thinned, and it is possible to achieve thinning of the semiconductor device.

Second Variation of First Exemplary Embodiment

In semiconductor device 100 illustrated in FIGS. 1A and 1B, the step in the outer edge region of extension part 2 is formed by rewiring layer 6 and the first surface of extension part 2. In this configuration, the step for suppressing the creeping-up of die bond 5 is only one step having a thickness of rewiring layer 6. In each example illustrated in FIGS. 3 to 6, the step is formed not by rewiring layer 6 but at extension part 2 itself. In this configuration as well, the step for suppressing the creeping-up of die bond 5 is one step.

Figure 7:
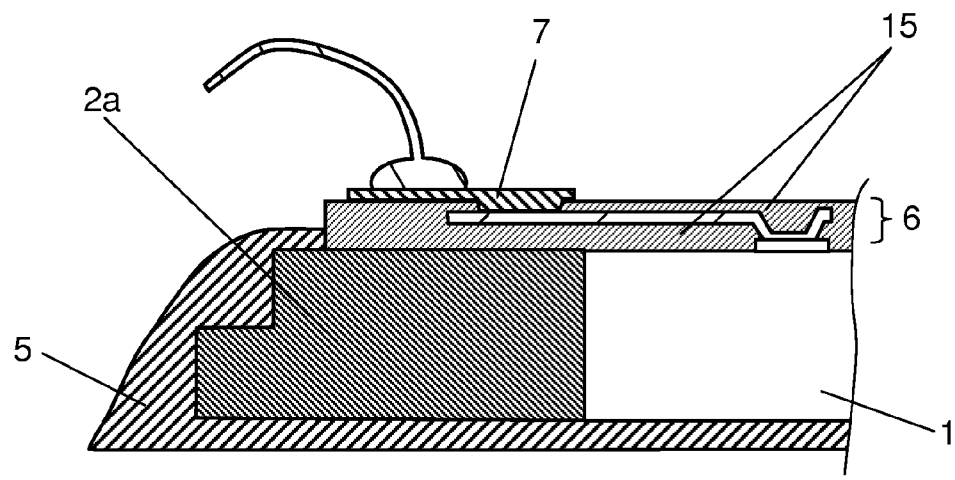
FIG. 7 is a sectional view illustrating a configuration of a semiconductor device according to a second variation of the first exemplary embodiment.
Figure 8:
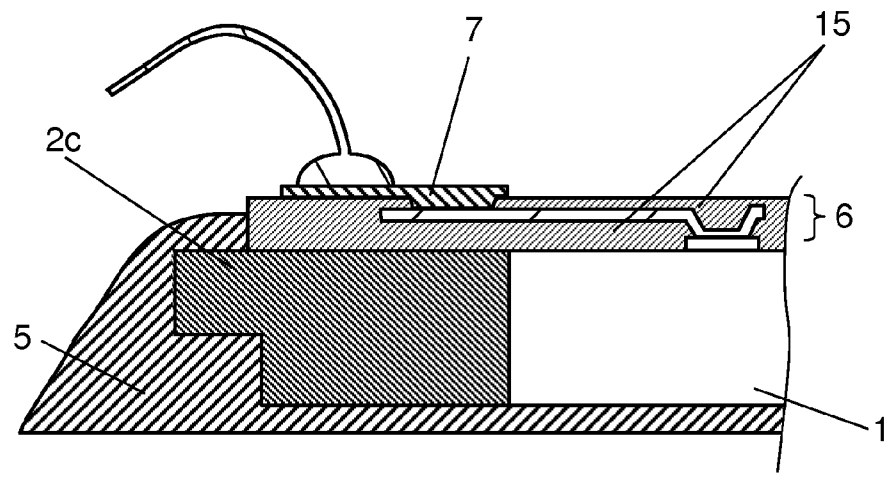
FIG. 8 is a sectional view illustrating a configuration of a semiconductor device according to the second variation of the first exemplary embodiment.

FIGS. 7 and 8 are sectional views schematically illustrating a part of a semiconductor device according to a second variation of the first exemplary embodiment. The "part" indicates a configuration of a part corresponding to the inside of the broken line A frame in semiconductor device 100 in FIG. 1A.

In an example illustrated in FIG. 7, a plurality of steps is formed in an outer edge region of extension part 2a. One is a first step formed on insulation layer 15 of rewiring layer 6 and a first surface of extension part 2a, and another is a second step formed at an end of extension part 2a itself. The second step is formed outside and below the first step and has a shape where a rear surface side of extension part 2a is protruded. Further, in an example illustrated in FIG. 8 as well, a plurality of steps is formed in an outer edge region of extension part 2c. A difference with FIG. 7 is that a second step has a shape where a first surface side of extension part 2c is protruded.

In these configurations, when die bond 5 creeps up from a rear surface of first semiconductor chip 1 in a direction of a main surface by surface tension, creeping-up speed is first reduced by the second step of extension part 2a or 2c. Moreover, because of the first step, infiltration and contamination of a wire bonding terminal 6 by die bond 5 can be prevented.

In this way, creeping-up of die bond 5 can be suppressed more by providing the plurality of steps in each outer edge region of extension parts 2a, 2c. Even if an amount or viscosity of die bond 5 to be used is different, it is possible to prevent contamination of wire bonding terminal 7 more reliably. Further, the effect can be expected even when first semiconductor chip 1 is thinned, and the semiconductor device is effectively thinned.

Third Variation of First Exemplary Embodiment

In semiconductor device 100 illustrated in FIGS. 1A and 1B, rewiring 14 is coated with insulation layer 15 at the end of rewiring layer 6 that forms the step with the first surface of extension part 2. The same applies to the examples illustrated in FIGS. 3 to 8.

Figure 9:
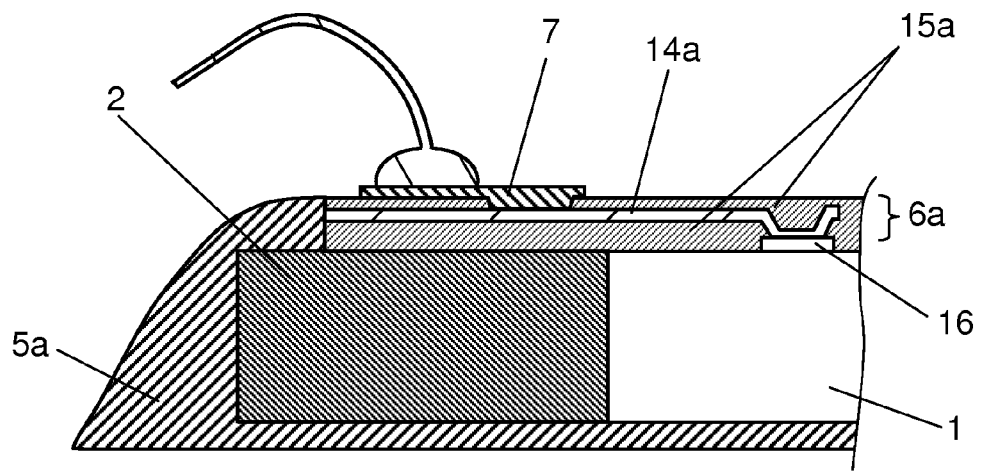
FIG. 9 is a sectional view illustrating a configuration of a semiconductor device according to a third variation of the first exemplary embodiment.
Figure 10:
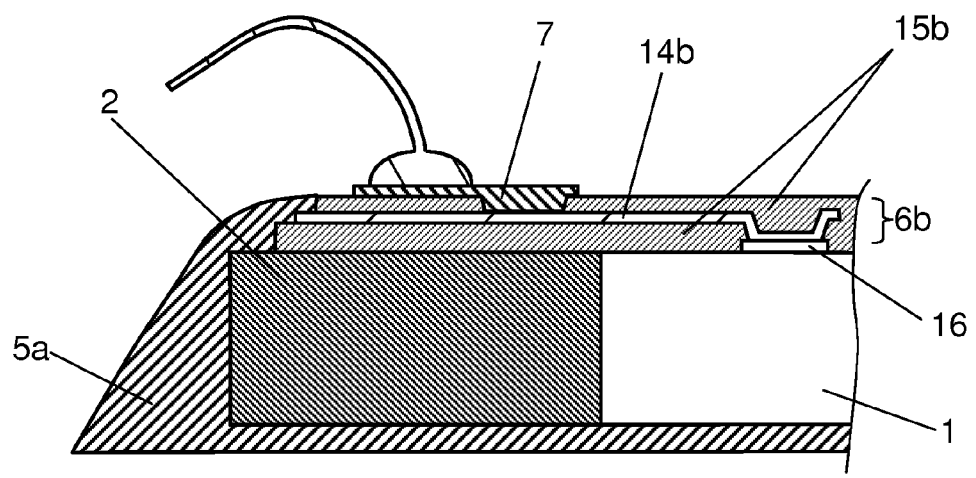
FIG. 10 is a sectional view illustrating a configuration of a semiconductor device according to the third variation of the first exemplary embodiment.

FIGS. 9 and 10 are sectional views schematically illustrating a part of a semiconductor device according to a third variation of the first exemplary embodiment. The "part" indicates a configuration of a part corresponding to the inside of the broken line A frame in semiconductor device 100 in FIG. 1A.

In an example illustrated in FIG. 9, a step is formed by a first surface of extension part 2 and rewiring layer 6a. Further, rewiring 14a is exposed from insulation layer 15a at an end of rewiring layer 6a. In other words, first semiconductor chip 1 is electrically drawn out to the end of rewiring layer 6a by rewiring 14a connected with electrode 16 of first semiconductor chip 1. Ends of insulation layer 15a and rewiring 14a are flush with each other.

In this configuration, when die bond 5a serving as a conductive paste is used, rewiring 14a and die bond 5a that has crept up to the first surface of extension part 2 are brought into contact with each other and are electrically connected. Here, when an electrode (not illustrated) for power supply is provided at a region of package substrate 4 where die bond 5a is applied, power can be supplied to first semiconductor chip 1 via die bond 5a.

In this configuration, creeping-up of die bond 5a is suppressed by the step formed by the first surface of extension part 2 and rewiring layer 6a, and contamination of wire bonding terminal 7 can be prevented. Moreover, it is possible to perform stable power supply to first semiconductor chip 1 from a part other than wire 8. As a result, an arrangement region of wire bonding terminal 7 is decreased, and a size of extension part 2 can be made small. Accordingly, reduction of manufacturing cost or miniaturization of the semiconductor device can be attained.

In an example illustrated in FIG. 10, in rewiring layer 6b, a part of insulation layer 15b is not formed on rewiring 14b, and a side surface and an upper surface of rewiring 14b is exposed.

With this configuration, since a contact area with die bond 5a serving as a conductive paste can be increased, it is possible to further stabilize power supply.

It should be noted that what is attained in the present variation is not limited to power supply. An electrode for GND of package substrate 4 and die bond 5a may be electrically connected, and a configuration employing the GND may be provided.

Manufacturing Method According to First Exemplary Embodiment and Variations of First Exemplary Embodiment FIGS. 11A to 13C are sectional views and a plan view schematically illustrating an example of a method for manufacturing semiconductor device 100 according to the first exemplary embodiment.

Figure 11A:
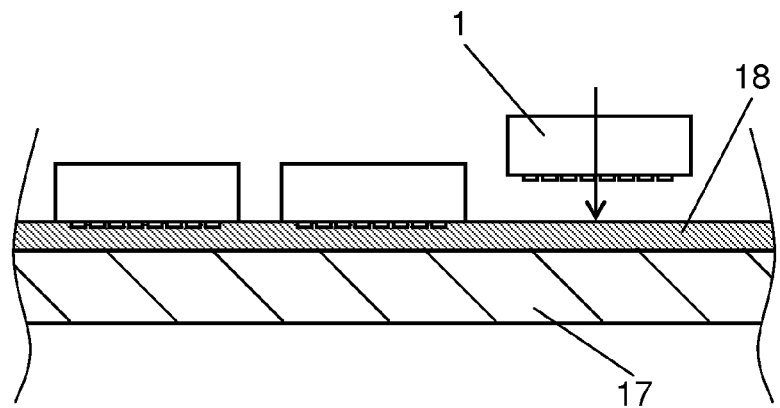
FIG. 11A is a sectional view illustrating a method for manufacturing the semiconductor device according to the first exemplary embodiment.
Figure 11B:
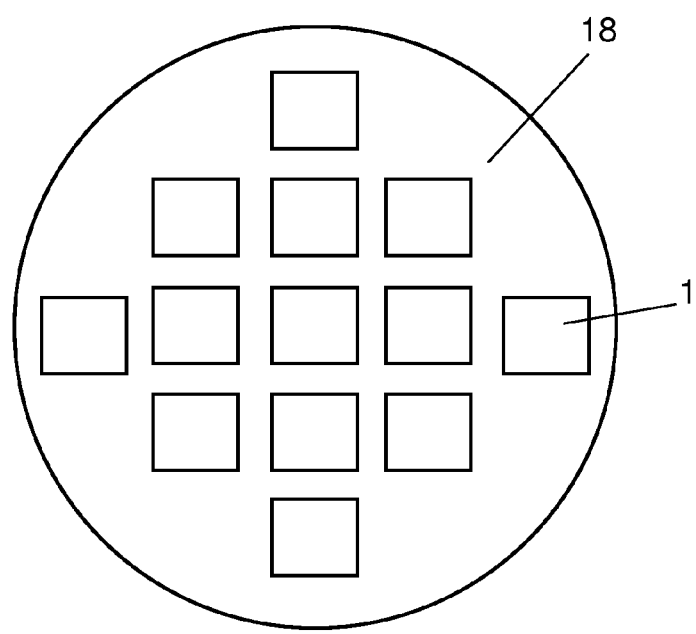
FIG. 11B is a plan view illustrating the method for manufacturing the semiconductor device according to the first exemplary embodiment.

As illustrated in FIG. 11A, adhesion layer 18 is formed on carrier wafer (reinforced substrate) 17, and first semiconductor chip 1 divided into individual pieces beforehand is placed on adhesion layer 18. As illustrated in FIG. 11B, the plurality of first semiconductor chips 1 is arrayed on carrier wafer 17 covered with the adhesion layer at predetermined intervals. Each of first semiconductor chips 1 is fixed in such a manner that the main surface adheres to adhesion layer 18.

Figure 12A:
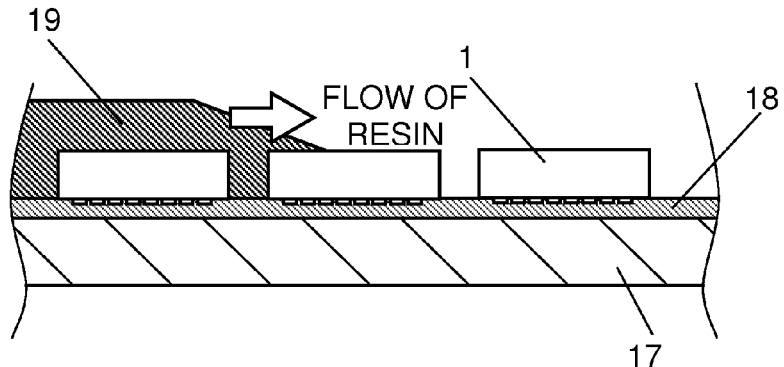
FIG. 12A is a sectional view illustrating the method for manufacturing the semiconductor device according to the first exemplary embodiment.
Figure 12B:
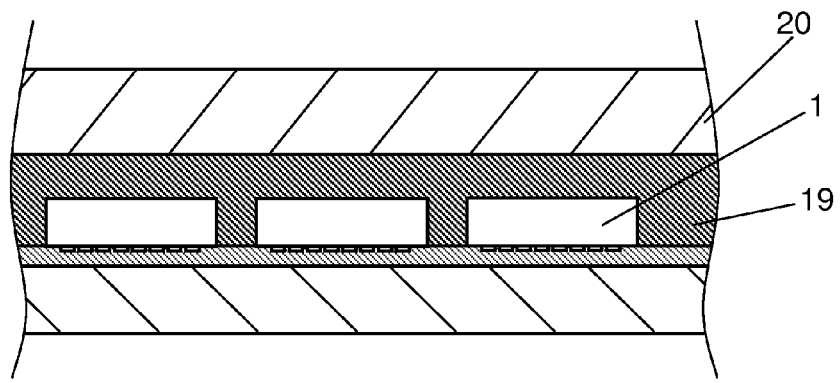
FIG. 12B is a sectional view illustrating the method for manufacturing the semiconductor device according to the first exemplary embodiment.
Figure 12C:
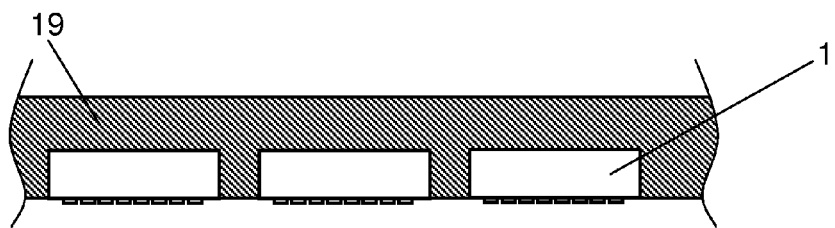
FIG. 12C is a sectional view illustrating the method for manufacturing the semiconductor device according to the first exemplary embodiment.
Figure 12D:
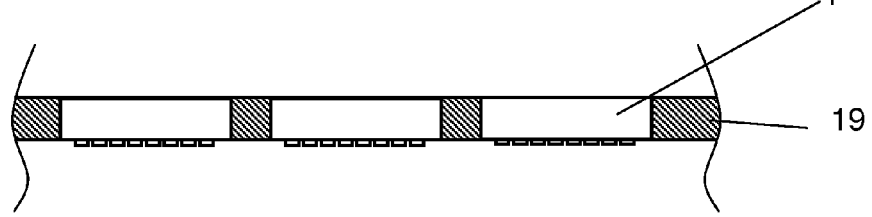
FIG. 12D is a sectional view illustrating the method for manufacturing the semiconductor device according to the first exemplary embodiment.

Next, as illustrated in FIG. 12A, extension member 19 for sealing fixed first semiconductor chip 1 is poured into carrier wafer 17. Extension member 19 is mainly a resin. As illustrated in FIG. 12B, the resin is cured by applying pressure and temperature by mold 20. At this time, the main surface of first semiconductor chip 1 and surfaces of the plurality of electrodes formed on the main surface are adhered to adhesion layer 18. As a result, extension member 19 covers only the side surfaces and the rear surface of first semiconductor chip 1, and does not contaminate the main surface of first semiconductor chip 1 and the electrodes formed on the main surface. After curing of the resin is completed, as illustrated in FIG. 12C, carrier wafer 17 and adhesion layer 18 are removed. Further, as illustrated in FIG. 12D, a thickness of extension member 19 is thinned. Extension member 19 may be cut until extension member 19 is flush with the rear surface of first semiconductor chip 1, or may be thinned leaving the resin covering the rear surface. Extension member 19 is configured so as to extend outward from side end surfaces of first semiconductor chip 1.

Figure 13A:
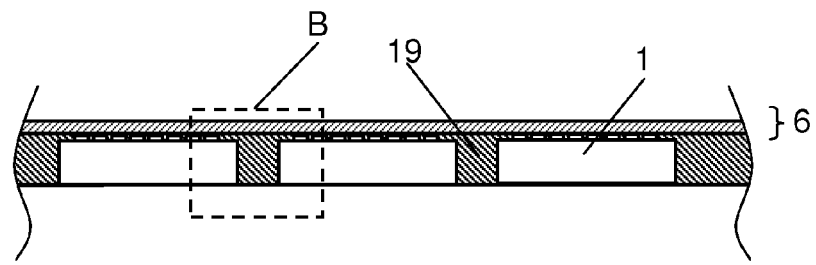
FIG. 13A is a sectional view illustrating the method for manufacturing the semiconductor device according to the first exemplary embodiment.
Figure 13B:
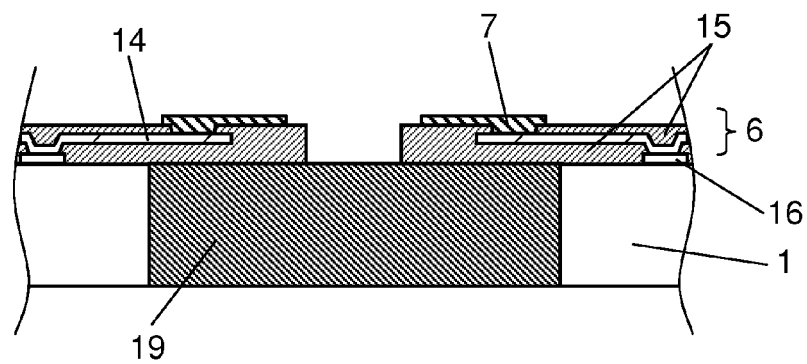
FIG. 13B is a sectional view illustrating the method for manufacturing the semiconductor device according to the first exemplary embodiment.

Next, as illustrated in FIG. 13A, rewiring layer 6 is formed from the main surface of first semiconductor chip 1 to extension member 19 by a photolithographic method. FIG. 13B illustrates a part corresponding to an inside of a broken line B frame in FIG. 13A. Rewiring 14 of rewiring layer 6 is connected to electrode 16 formed at the peripheral edge of first semiconductor chip 1, and is installed so as to drawn out the electrical connection of electrode 16 to a region of extension member 19. Further, in the region of extension member 19, wire bonding terminal 7 is formed on rewiring 14, and an electrical path from first semiconductor chip 1 to wire bonding terminal 7 is configured. Rewiring layer 6 is not formed at a cutting scheduled region of extension member 19, an inside of the cutting scheduled region, and a part outside wire bonding terminal 7, thereby exposing extension member 19. In this way, a step is formed by an end surface (insulation layer 15 in the present exemplary embodiment) of rewiring layer 6 and an exposed surface of extension member 19.

Figure 13C:
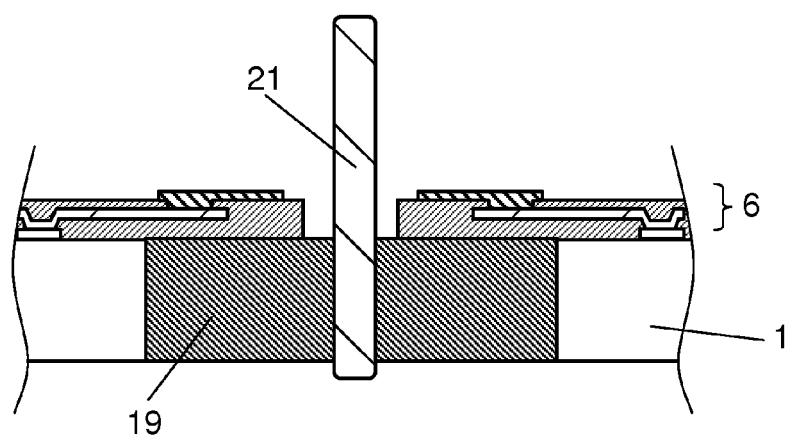
FIG. 13C is a sectional view illustrating the method for manufacturing the semiconductor device according to the first exemplary embodiment.

Eventually, extension member 19 is cut by dicing blade 21 illustrated in FIG. 13C, and first semiconductor chip 1 including extension part 2 is divided into individual pieces. By cutting the part of the region of extension member 19 where rewiring layer 6 is not disposed, an individually-divided chip including the step formed by the exposed surface of extension member 19 (extension part 2) and the end of rewiring layer 6 is obtained. The individually-divided chip is mounted on package substrate 4, thereby configuring semiconductor device 100 illustrated in FIG. 1A.

Hereinabove, in the manufacturing method of the present exemplary embodiment, a part of rewiring layer 6 on extension member 19 is not formed beforehand. Accordingly, as illustrated in FIG. 1B, the semiconductor device including the step that prevents creeping-up of die bond 5 to the region of extension part 2 can be obtained without using a special processing method.

The first to third variations of the first exemplary embodiment illustrated in FIGS. 3 to 10 can be also generally formed according to the aforementioned manufacturing method. However, there are differences in a process of forming rewiring layer 6 or a process of cutting the region of extension member 19. The differences will be described by giving some examples.

Figure 14A:
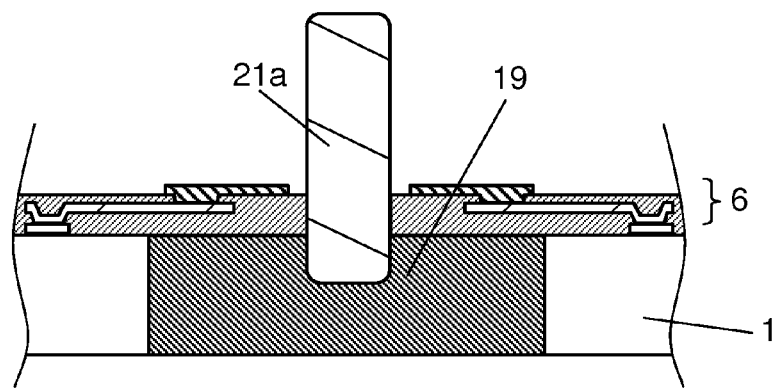
FIG. 14A is a sectional view illustrating a method for manufacturing the semiconductor device according to the first variation of the first exemplary embodiment.
Figure 14B:
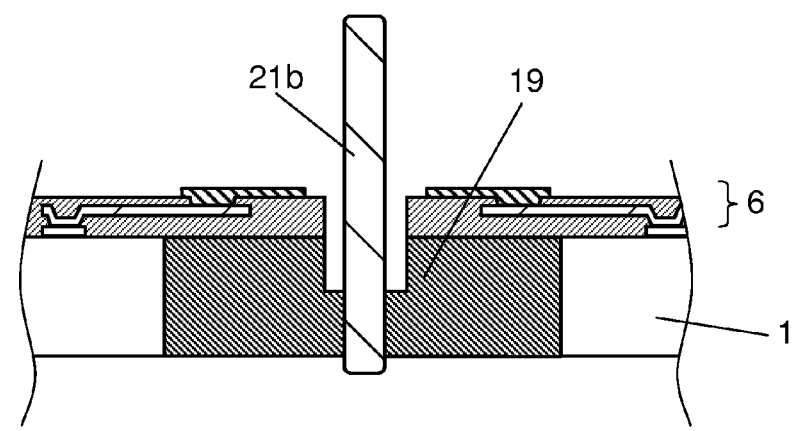
FIG. 14B is a sectional view illustrating the method for manufacturing the semiconductor device according to the first variation of the first exemplary embodiment.
Figure 14C:
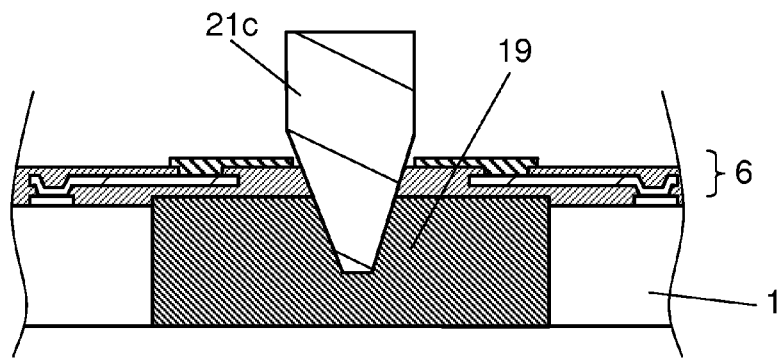
FIG. 14C is a sectional view illustrating the method for manufacturing the semiconductor device according to the first variation of the first exemplary embodiment.

FIGS. 14A to 14C illustrate the process of cutting the region of extension member 19 in the manufacturing method according to the first variation of the first exemplary embodiment.

FIG. 14A illustrates a process of cutting rewiring layer 6 and a midway position of extension member 19 by processing with dicing blade 21a. On a sectional surface, the end of rewiring layer 6 and the end of extension part 2 are flush with each other. At this time, rewiring layer 6 may be formed on an entire upper surface of extension member 19. Further, as illustrated in FIG. 14B, a rear surface of extension member 19 is cut and extension member 19 is divided into individual pieces by using dicing blade 21b. Dicing blade 21b is narrower than dicing blade 21a which has cut rewiring layer 6. Such stepwise cutting method using dicing blades with different widths is generally called "step cut." By this cutting process, it is possible to form the step illustrated in FIG. 3 where the rear surface side of extension part 2 is protruded.

The step where the first surface side of the extension part is protruded as in FIG. 5 can be also formed by the step cut. The rear surface side can be cut by dicing blade 21a with a wide width, and the first surface side can be cut by dicing blade 21b with a narrow width.

Further, instead of dicing blade 21a in FIG. 14A, the step cut may be performed by using tapered dicing blade 21c as in FIG. 14C. The step cut out in the oblique direction illustrated in FIG. 4 or 6 can be formed by this process. Alternatively, rewiring layer 6 and extension member 19 can be cut simultaneously by the tapered dicing blade.

In order to form a step in the region of extension part 2, methods other than the adjustment of a region where rewiring layer 6 is formed or the dicing processing will be mentioned.

Figure 15:
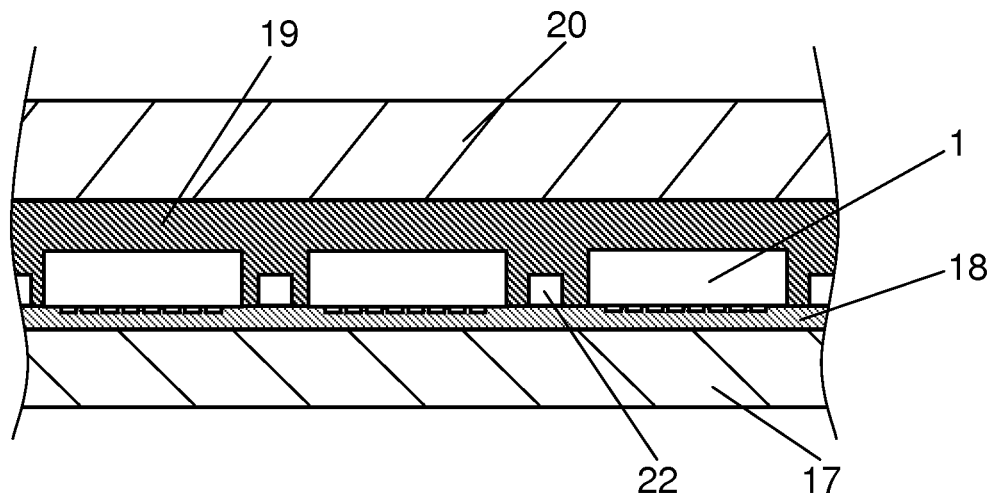
FIG. 15 is a sectional view illustrating a method for manufacturing the semiconductor device according to the first exemplary embodiment and the variations.

One is a method of mounting spacer 22 between the plurality of semiconductor chips 1 beforehand in the process of mounting first semiconductor chip 1 in FIG. 11A. As illustrated in FIG. 15, extension member 19 is poured into carrier wafer 17 and cured by using mold 20. Then, a step is formed by removing spacers 22 together with carrier wafer 17 and adhesion layer 18. According to this method, a step shape can be freely controlled by changing a shape of spacer 22. Further, since the dicing blade is not used, there is no possibility of damaging a circuit formed surface of first semiconductor chip 1 or rewiring layer 6 by chipping or the like.

Figure 16:
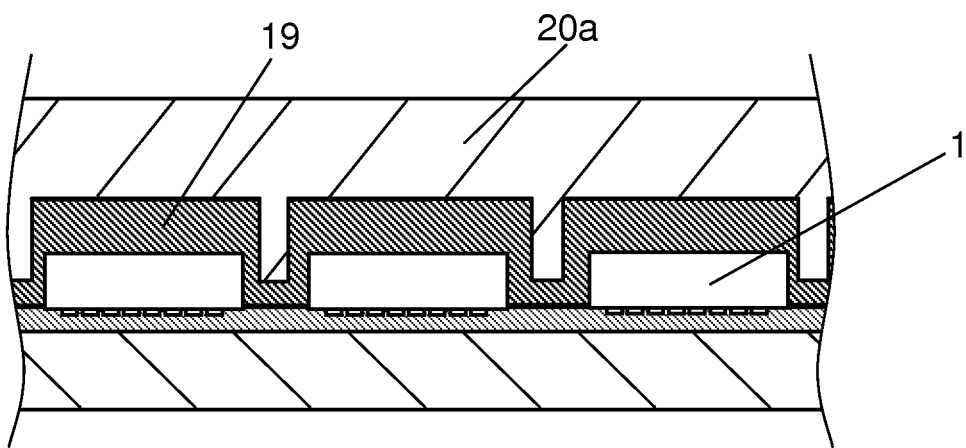
FIG. 16 is a sectional view illustrating a method for manufacturing the semiconductor device according to the first exemplary embodiment and the variations.

As illustrated in FIG. 16, another method is a method of providing a plurality of protrusion shapes on a surface side of mold 20a in contact with extension member 19 and forming a step at extension member 19 by this protrusion shape. With this configuration, the step can be obtained by the shape of mold 20a in the process of forming extension member 19. Accordingly, it is not necessary to add a process for forming a step, and the method is efficient. Further, the step shape can be formed freely by changing the protrusion shape. Moreover, since the dicing blade is not used, there is no possibility of damaging the circuit formed surface of first semiconductor chip 1 or rewiring layer 6 by chipping or the like.

Other Aspects

Hereinabove, the first exemplary embodiment, the first to third variations of the first exemplary embodiment, the manufacturing methods, and the like are described as illustration of the technique disclosed in the present application. However, the technique in the present disclosure is not limited to this, and is appropriately applicable to exemplary embodiments where modifications, replacements, additions, omissions or the like have been made. Further, a new exemplary embodiment can be made by combining the respective components described in the first exemplary embodiment and the variations described above.

Examples of the other aspects will be described below.

Figure 17:
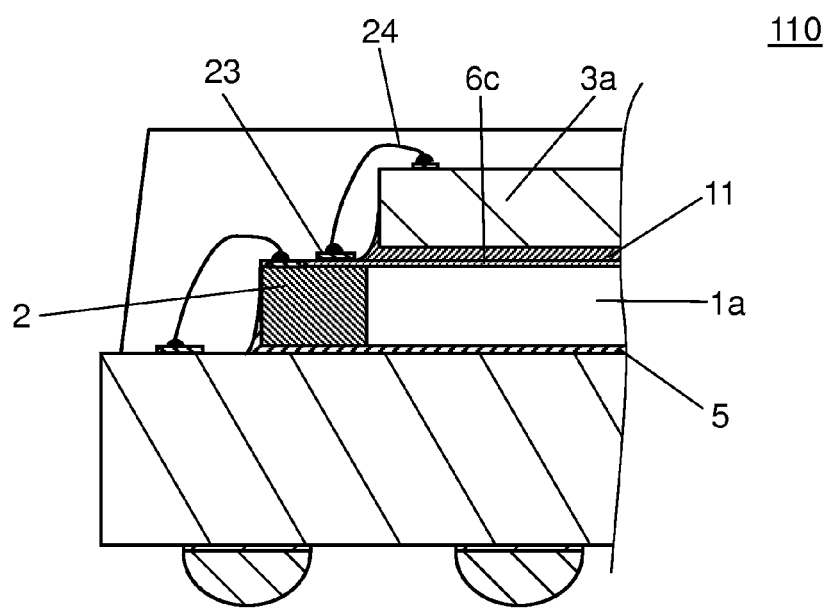
FIG. 17 is a sectional view illustrating a configuration of a semiconductor device according to another aspect.
Figure 18:
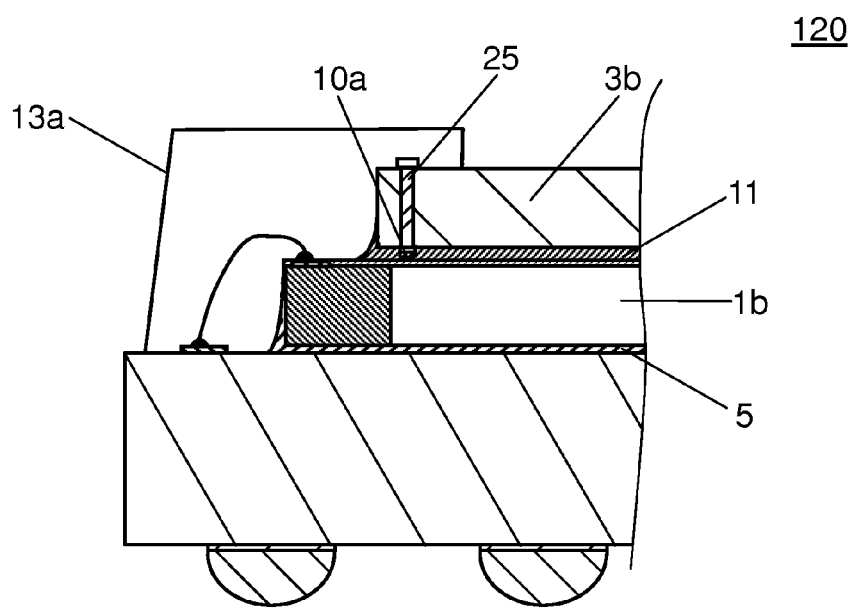
FIG. 18 is a sectional view illustrating a configuration of a semiconductor device according to another aspect.

In the first exemplary embodiment, the first to third variations of the first exemplary embodiment, and the manufacturing methods, second semiconductor chip 3 is flip-chip connected to first semiconductor chip 1 via bump 10. However, the two semiconductor chips may have a connection configuration other than this flip-chip connection. Specifically, as illustrated in FIGS. 17 and 18, a surface of second semiconductor chip 3 on a side opposite to a circuit formed surface may be firmly fixed to a main surface of first semiconductor chip 1. At this time, circuits, electrodes, or the like of first semiconductor chip 1 and second semiconductor chip 3 are designed suitable for the respective connection configurations.

In semiconductor device 110 illustrated in FIG. 17, an electrode of second semiconductor chip 3a and wire bonding terminal 23 drawn out from first semiconductor chip 1a to extension part 2 via rewiring layer 6c are connected by wire 24. Accordingly, electrical connection of first semiconductor chip 1a and second semiconductor chip 3a is obtained. Besides, as semiconductor device 120 illustrated in FIG. 18, penetration electrode 25 is provided from an electrode formed on a circuit surface of second semiconductor chip 3b to a rear surface, and second semiconductor chip 3b on a rear surface side is electrically connected with first semiconductor chip 1b. At this time, an electrode on the rear surface of second semiconductor chip 3b and an electrode on a main surface of first semiconductor chip 1b are connected, for example, by bump 10a.

Further, sealing resin 13 does not need to cover entire second semiconductor chip 3. For example, as illustrated in FIG. 18, sealing resin 13a seals a connection electrode with first semiconductor chip 1b, and may expose a center part of second semiconductor chip 3b. This configuration can be employed especially when a sensor or an element having a light emitting function is formed on a circuit surface of second semiconductor chip 3b.

As described above, as illustration of the technique in the present disclosure, the exemplary embodiments, the variations, and the like have been described by the accompanying drawings and the detailed description. In the components described in the accompanying drawings and the detailed description, not only the components which are essential for solving the problem, but also the components which are not essential for solving the problem to illustrate the above-described technique can be included. Accordingly, when those nonessential components are described in the accompanying drawings and the detailed description, those nonessential components should not be immediately recognized as essential components.

Further, since the aforementioned exemplary embodiments and variations illustrate the technique in the present disclosure, various modifications, replacements, additions, omissions, or the like can be made within the claims and their equivalents.

The present disclosure is applicable to a semiconductor device that includes an extended semiconductor chip provided with a wire bonding terminal.

What is claimed is:

1. A semiconductor device comprising:
a first semiconductor chip having a main surface on which electrodes are formed;
an extension part extended outward from a side end surface of the first semiconductor chip;
a rewiring layer formed from the main surface of the first semiconductor chip to a first surface of the extension part;
a connection terminal provided on the rewiring layer of the extension part;
a die bond disposed between a rear surface of the first semiconductor chip and a substrate, and between a rear surface of the extension part and the substrate, so that the die bond fixes the first semiconductor chip and the extension part to the substrate; and
a step disposed outwardly from the connection terminal of the extension part in a direction away from the first semiconductor chip.

2. The semiconductor device according to claim 1, wherein a second semiconductor chip is mounted on the main surface of the first semiconductor chip.

3. The semiconductor device according to claim 1, wherein the connection terminal is a wire bonding terminal, and
the connection terminal is connected with an electrode pad by a wire, the electrode pad being provided on a surface of the substrate on which the first semiconductor chip is mounted.

4. A semiconductor device comprising:
a first semiconductor chip having a main surface on which electrodes are formed;
an extension part extended outward from a side end surface of the first semiconductor chip;
a rewiring layer formed from the main surface of the first semiconductor chip to a first surface of the extension part;
a connection terminal provided on the rewiring layer of the extension part;
a die bond that fixes the first semiconductor chip and the extension part to a substrate; and
a step disposed outside the connection terminal of the extension part,
wherein the step is a first step formed by the first surface of the extension part and an end of the rewiring layer formed inside an end of the extension part.

5. The semiconductor device according to claim 4, wherein the rewiring layer has an insulation layer and a rewiring, and
the end of the rewiring layer that forms the first step is formed only of the insulation layer.

6. The semiconductor device according to claim 4, wherein the rewiring layer has an insulation layer and a rewiring, and
the rewiring is exposed from the insulation layer at the end of the rewiring layer that forms the first step.

7. The semiconductor device according to claim 6, wherein the die bond is a conductive paste, and
the die bond is in contact with the rewiring at the end of the rewiring layer that forms the first step.

8. The semiconductor device according to claim 4 wherein the step includes a second step formed stepwise by protruding a part of the end of the extension part.

9. The semiconductor device according to claim 8, wherein the second step is formed by protruding a rear surface side of the extension part, and
a plurality of steps is formed by combining the second step with the first step.

10. The semiconductor device according to claim 8, wherein the second step is formed by protruding a first surface side of the extension part, and
a plurality of steps is formed by combining the second step with the first step.

11. A semiconductor device comprising:
a first semiconductor chip having a main surface on which electrodes are formed;
an extension part extended outward from a side end surface of the first semiconductor chip;
a rewiring layer formed from the main surface of the first semiconductor chip to a first surface of the extension part;
a connection terminal provided on the rewiring layer of the extension part,
a die bond that fixes the first semiconductor chip and the extension part to a substrate; and
a step disposed outside the connection terminal of the extension part,
wherein the die bond covers at least a part of a side surface and the first surface of the extension part while avoiding an upper surface of the rewiring layer.

12. A semiconductor device comprising:
  a first semiconductor chip having a main surface on which electrodes are formed;
  an extension part extended outward from a side end surface of the first semiconductor chip;
  a rewiring layer formed from the main surface of the first semiconductor chip to a first surface of the extension part;
  a connection terminal provided on the rewiring layer of the extension part;
  a die bond that fixes the first semiconductor chip and the extension part to a substrate; and
  a step disposed outside the connection terminal of the extension part,
  wherein the step is a second step formed stepwise by protruding a part of an end of the extension part.

13. The semiconductor device according to claim 12, wherein the second step is formed by protruding a first surface side of the extension part.

14. The semiconductor device according to claim 13, wherein the die bond covers at least a part of a side surface of the extension part and the second step while avoiding an upper surface of the rewiring layer.

15. The semiconductor device according to claim 12, wherein the second step is formed by protruding a rear surface side of the extension part.

16. The semiconductor device according to claim 15, wherein the die bond covers at least the second step while avoiding an upper surface and a side surface of the rewiring layer.

17. The semiconductor device according to claim 12, wherein a side surface of the second step is tapered.

* * * * *